United States Patent [19]

Aida

[11] Patent Number: 5,275,798
[45] Date of Patent: Jan. 4, 1994

[54] METHOD FOR PRODUCING DIAMOND FILMS

[75] Inventor: Hiroshi Aida, Kyoto, Japan

[73] Assignee: Kyocera Corporation, Kyoto, Japan

[21] Appl. No.: 969,504

[22] Filed: Oct. 29, 1992

Related U.S. Application Data

[63] Continuation of Ser. No. 667,008, Mar. 11, 1991, abandoned, which is a continuation of Ser. No. 332,410, Mar. 30, 1989, abandoned, which is a continuation of Ser. No. 72,060, Jul. 10, 1987, abandoned.

[30] Foreign Application Priority Data

| | | | |
|---|---|---|---|
| Jul. 11, 1986 | [JP] | Japan | 61-163993 |
| Jul. 11, 1986 | [JP] | Japan | 61-163994 |
| Jul. 11, 1986 | [JP] | Japan | 61-163996 |
| Jul. 11, 1986 | [JP] | Japan | 61-163997 |
| Jul. 23, 1986 | [JP] | Japan | 61-174470 |

[51] Int. Cl.$^5$ .............................. B01J 3/06; B23P 5/00
[52] U.S. Cl. .............................. 423/446; 156/DIG. 68; 427/571; 427/517
[58] Field of Search .............................. 423/446; 156/DIG.; 54/86; 427/450, 571, 577

[56] References Cited

U.S. PATENT DOCUMENTS

| | | | |
|---|---|---|---|
| 3,749,760 | 7/1973 | Deryagin | 423/446 |
| 3,961,103 | 6/1976 | Aisenberg | 423/446 |
| 4,434,188 | 2/1984 | Kamo et al. | 423/446 |
| 4,816,286 | 3/1989 | Hirose | 423/446 |

FOREIGN PATENT DOCUMENTS

| | | | |
|---|---|---|---|
| 628567 | 10/1961 | Canada | 423/446 |
| 0161829 | 11/1985 | European Pat. Off. | 423/446 |
| 1456871 | 9/1966 | France | 423/446 |
| 59-35092 | 2/1984 | Japan | 423/446 |
| 60-127293 | 7/1985 | Japan | 423/446 |
| 60-145995 | 8/1985 | Japan | 423/446 |
| 60-191097 | 9/1985 | Japan | 423/446 |
| 60-195094 | 10/1985 | Japan | 423/446 |
| 61-151095 | 7/1986 | Japan | 423/446 |
| 61-286299 | 12/1986 | Japan | 423/446 |

*Primary Examiner*—Robert Kunemund
*Attorney, Agent, or Firm*—Spensley Horn Jubas & Lubitz

[57] ABSTRACT

Disclosed is a method for the production of diamond films, which comprise introducing a diamond-forming gas into a reaction chamber in which a substrate is located, activating the gas in the reaction chamber and depositing diamond on the substrate by decomposition of the gas, wherein the diamond-forming gas is a gas or gas mixture containing hydrogen, oxygen and carbon atoms at an atomic ratio satisfying requirements represented by the following formulae:

$2 \geq C/H \geq 0.0005$, and $4 \geq O/C \geq 0.0005$.

8 Claims, 5 Drawing Sheets

METHOD FOR PRODUCING DIAMOND FILMS

This is a continuation of application Ser. No. 07/667,008 filed on Mar. 11, 1991, now abandoned, which is a continuation of application Ser. No. 07/332,410 filed on Mar. 30, 1989, now abandoned, which is a continuation of application Ser. No. 07/072,060 filed on Jul. 10, 1987, now abandoned.

BACKGROUND OF THE INVENTION (1) Field of the Invention

The present invention relates to a method for producing diamond films, in which the diamond characteristics of a formed film are improved and the film-forming speed is increased. Furthermore, the present invention relates to a cutting tool provided with a diamond film and a process for the production thereof.

(2) Description of the Prior Art

Diamond is synthesized under a super-high pressure at a super-high temperature by using an expensive apparatus. Furthermore, the low-pressure gas phase synthetic technique is investigated as means for providing diamond capable of being widely applied to various uses by utilizing excellent characteristics such as high hardness and thermal conductivity and excellent semiconductor characteristics and increasing the synthesis efficiency. For example, the synthesis of diamond by the plasma (Chemical Vapor Deposition) CVD method is proposed.

According to this synthesis of diamond by the plasma CVD method, a mixed gas comprising a hydrocarbon gas and hydrogen gas is introduced into a reaction chamber, a plasma is generated by a high-frequency wave, a microwave or a direct current voltage, and a diamond film is formed on the surface of a substrate (see Japanese Patient Laid-Open Nos. 58-153774 and 59-3098).

However, if the mixed gas comprising a hydrocarbon gas and hydrogen gas is used as the diamond-forming gas, the diamond-forming speed is low, and 3 to 4 hours are necessary for obtaining a film thickness of about 1 $\mu$m.

Moreover, the diamond film obtained according to this plasma CVD method is still insufficient in the diamond characteristics such as high hardness, and further improvement of the diamond characteristics is desired.

A cutting tool prepared by arranging a diamond film obtained by this plasma CVD method on a predetermined substrate is insufficient in the cutting properties, and further improvement of the cutting properties is desired.

Especially, since amorphous carbon is contained in the diamond film formed according to the conventional CVD method, the purity is low, and therefore, the excellent abrasion resistance is not sufficiently exerted. Since the abrasion resistance is very important as a factor deciding the life of a cutting tool for r precision working or finish working, development of a cutting tool having an excellent abrasion resistance is desired.

SUMMARY OF THE INVENTION

It is therefore a primary object of the present invention to provide a method for the production of diamond films, in which the above-mentioned problems are solved and the manufacturing cost is decreased by increasing the diamond-forming speed.

Another object of the present invention is to provide a method for the production of diamond films excellent in the diamond characteristics such as high hardness.

Still another object of the present invention is to provide a diamond-covered cutting tool provided with a high-purity diamond film on the surface thereof, which has an excellent abrasion resistance and a long life, and a process for the production thereof.

In accordance with one fundamental aspect of the present invention, there is provided a method for the production of diamond films, which comprises introducing a diamond-forming gas into a reaction chamber in which a substrate is located, activating the gas in the reaction chamber and depositing diamond on the substrate by decomposition of the gas, wherein the diamond-forming gas is a gas or gas mixture containing hydrogen, oxygen and carbon atoms at an atomic ratio satisfying requirements represented by the following formulae:

$$2 \geq C/H \geq 0.0005, \text{ and}$$

$$4 \geq O/C \geq 0.0005.$$

In accordance with another aspect of the present invention, there is provided a process for the production of cutting tools, which comprises introducing a diamond-forming gas into a reaction chamber in which a tool base is located and performing the vapor deposition of diamond on the tool base by decomposition of the gas, wherein the diamond-forming gas is a gas or gas mixture containing hydrogen, oxygen and carbon atoms at an atomic ratio satisfying requirements represented by the following formulae:

$$2 \geq C/H \geq 0.0005, \text{ and}$$

$$4 \geq O/C \geq 0.0005,$$

and the average linear expansion coefficient of the tool base is $2.8 \times 10^{-6}$ to $6.0 \times 10^{-6}/°$C. when the temperature of the tool base is elevated from room temperature to 800° C.

In accordance with still another aspect of the present invention, there is provided a diamond-covered cutting tool comprising a tool base and a diamond film formed on the surface of the tool base by the film-forming method, wherein the average linear expansion coefficient of the tool base is $2.8 \times 10^{-6}$ to $6.0 \times 10^{-6}/°$C. when the temperature of the tool base is elevated from room temperature to 800° C., and the diamond film is a polycrystalline diamond film having a thickness of 1 to 200 $\mu$m and a spectrum area ratio ($R_I$) smaller than 10, said spectrum area ratio ($R_I$) being defined by the following formula:

$$R_I = I/I_{1330}$$

wherein $I_{1330}$ stands for the area of the characteristic peak in the vicinity of a wave number of 1330 cm$^{-1}$ in the laser Raman spectroscopic analysis of the diamond film, and I stands for the area of peaks at wave numbers of 1000 to 1800 cm$^{-1}$, other than said characteristic peak of diamond, in said spectroscopic analysis.

DETAILED DESCRIPTION OF THE PREFERRED EMBODIMENTS

Figure 1:
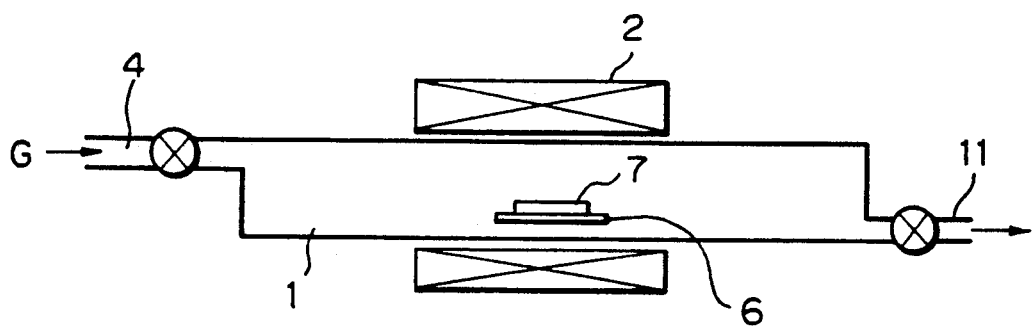
FIG. 1 is a diagram illustrating the arrangement of a high-frequency wave chemical vapor deposition (CVD) apparatus to be used for forming a diamond film according to the present invention.

According to the plasma CVD method as one of the film-forming means adopted in the present invention, the electron in a plasma space has a much larger kinetic energy than an ion or a neutral molecule seed. Accordingly, hydrogen or a hydrocarbon is excited by collosion with this electron in the plasma space, and reaction is promoted with relative reduction of the activation energy of the reaction. Furthermore, hydrogen and the hydrocarbon are decomposed to a hydrogen atom and a methyl radical, respectively, and the carbon atom is regularly arranged on the surface of a substrate heated at a predetermined temperature, whereby diamond is precipitated.

As the diamond-forming gas, there are generally used a hydrogen gas for forming a hydrogen plasma and a hydrocarbon gas as the carbon source for forming diamond, as disclosed in Japanese Patent Laid-Open No. 58-135117. The hydrogen atom in this reaction gas generates a hydrogen plasma efficiently or removes graphite formed with formation of diamond by reaction with this graphite.

However, the hydrocarbon or carbon activated in the plasma space collides with the hydrogen gas or hydrogen atom formed by the decomposition to cause re-binding and the activity is lost. Accordingly, only a part of the hydrocarbon which has arrived at the substrate deposites in formation of diamond, while the majority of the hydrocarbon is released into the gas phase again.

The present invention is based on the finding that if a gas or gas mixture containing hydrogen (H), oxygen (O) and carbon (C) atoms at an atomic ratio represented by the following formulae:

$$2 \geq C/H \geq 0.0005 \quad (1)$$

and $$4 \geq O/C \geq 0.0005 \quad (2)$$

especially, $$0.5 \geq C/H \geq 0.01 \quad (3)$$

and $$1.2 \geq O/C \geq 0.01 \quad (4)$$

is used as the diamond-forming gas to be supplied into the plasma space, the diamond film-forming speed is greatly increased and the formed diamond film is excellent in characteristics such as purity and hardness.

The reason why the diamond film-forming speed is increased and the quality of the formed diamond film is improved by making an oxygen atom at a certain concentration has not been sufficiently elucidated. However, it is presumed that the reason may be as follows.

By decomposition of an oxygen-containing gas or oxygen-containing organic compound supplied into the plasma space, an ion seed of oxygen is formed, and this ion seed reacts with the hydrocarbon or the like and the activation of the entire system is promoted, which results in increase of the forming speed. Since a large quantity of hydrogen is contained in the diamond-forming gas, hydrogen is included into the film with formation of the film to degrade inherent characteristics of the diamond film. In contrast, if oxygen is introduced according to the present invention, hydrogen to be included into the film with formation of the film is extracted, with the result that the inherent characteristics of diamond are improved.

In accordance with one preferred embodiment, a mixed gas comprising (i) hydrogen and (ii) a gas or vapor of an organic compound comprising carbon, hydrogen and oxygen as constituent elements is used as the diamond-forming gas. The hydrogen atom in the reaction gas generates a hydrogen plasma efficiently or removes graphitic carbon formed with formation of diamond by reaction with this graphitic carbon.

As the oxygen-containing organic compound used in this embodiment, there can be mentioned alcohols such as methanol, ethanol, propanol and butanol, ethers such as methyl ether, ethyl ether, ethylmethyl ether, methylpropyl ether, ethylpropyl ether, phenol ether, acetal and cyclic ethers (ethylene oxide and dioxane), ketones such as acetone, pinacolin, mesityloxide, aromatic ketones (acetophenone, benzophenone), diketone and cyclic ketone, aldehydes such as formaldehyde, acetaldehyde, butyl aldehyde and aromatic aldehydes (benzaldehyde and the like), organic acids such as formic acid, acetic acid, propionic acid, succinic acid, butyric acid, oxalic acid, tartaric acid and stearic acid, esters such as methyl acetate, ethyl acetate, propyl acetate and butyl acetate, and dihydric alcohols such as ethylene glycol, triethylene glycol and diethylene glycol. Among these oxygen-containing organic compounds, there are preferably used compounds which are gaseous at normal temperature as hydrocarbons, such as methyl ether and ethylene oxide, and compounds having a high vapor pressure, such as methanol, ethanol, propanol, butanol, methyl ether, ethyl ether, ethylmethyl ether, methylpropyl ether, ethylpropyl ether, acetone, formaldehyde, acetaldehyde, butyl aldehyde, formic acid, acetic acid, methyl acetate, ethyl acetate, propyl acetate and butyl acetate. In short, oxygen-containing organic compounds having up to 5 carbon atoms are preferred, and oxygen-containing compounds having an O/C atomic ratio of from 0.5 to 1.2 are especially preferred.

A part of hydrogen may be substituted by an inert gas such argon or helium. It is important that in these diamond-forming gases, the ratio of the gas components and the flow rate should be adjusted so that the above-mentioned atomic ratio is maintained.

In accordance with another preferred embodiment of the present invention, a mixed gas comprising (i) hydrogen, (ii) a hydrocarbon compound gas and (iii) an oxygen-containing compound gas is used as the diamond-forming gas.

As the hydrocarbon used in the present invention, there can be mentioned saturated linear hydrocarbons such as methane, ethane, propane and butane, unsaturated linear hydrocarbons such as ethylene, propylene, acetylene and allene, alicyclic hydrocarbons such as cyclopropane, cyclobutane and cyclopentane, and aromatic hydrocarbons such as benzene, toluene and xylene. A hydrocarbon which is gaseous at normal temperature is preferred from the viewpoint of the handling easiness.

As the oxygen-containing compound gas, there can be mentioned gases and vapors of the above-mentioned organic compounds comprising carbon, hydrogen and oxygen as constituent elements, and molecular oxygen and ozone, carbon oxides such as carbon monoxide and carbon dioxide, hydrogen oxides such as water and hydrogen peroxide and nitrogen oxides such as nitrogen suboxide, nitrogen monoxide and nitrogen dioxide. The oxygen-containing organic compound and the oxygen-containing inorganic gas may be used singly or in combination.

Also in the present embodiment, the compounds (i) through (iii) are supplied at such ratio and flow rate that the above-mentioned requirements of the atomic ratio are satisfied.

In accordance with still another embodiment of the present invention, an oxygen-containing inorganic gas is incorporated into a mixed gas comprising (i) hydrogen and a gas or vapor of an organic compound having carbon, hydrogen and oxygen as constituent elements.

According to this embodiment, even if an organic compound (ii) having a low oxygen ratio (O)/(C) per molecule is used, by incorporating an inorganic gas having a high oxygen content, the oxygen content in the diamond-forming gas as a whole can be controlled to a preferred level.

In the present invention, it is preferred that the temperature of the substrate on which a diamond film is to be formed and the gas pressure during formation of the film be set within predetermined ranges. According to the experiments made by us, it was confirmed that the objects of the present invention can be advantageously attained if the substrate temperature is adjusted to 400° to 1400° C. and the gas pressure is adjusted to $10^{-5}$ to 100 Torr.

The plasma CVD method used in the present invention is divided in various types according to the kind of the plasma-generating means. For example, there can be mentioned high-frequency wave plasma CVD, microwave plasma CVD and electron cyclotron resonance (ECR) plasma CVD. According to each of these methods, the intended effects of the present invention can be similarly attained.

Referring to FIG. 1 illustrating the high-frequency wave CVD method, a high frequency coil 2 connected to the high frequency oscillator (not shown) is arranged on the periphery of a reaction chamber 1 formed of a quartz tube. A substrate 7 set on a sample supporting stand 6 is placed in the reaction chamber 1. A gas-introducing tube 4 is attached to one end of the reaction chamber 1, and an exhaust gas outlet 11 connected to a rotary pump (not shown) is formed on the other end of the reaction chamber 1.

The substrate 7 is placed in the reaction chamber 1 and adjusted to the above-mentioned temperature. A high-frequency current of 0.01 to 100 MHz is applied to the high frequency coil 2, and simultaneously, a diamond-forming gas G in which the C/H and O/H ratios are adjusted within the above-mentioned ranges is introduced through the gas-introducing tube 4 to set the inner pressure of the reaction chamber within the above-mentioned range, whereby a plasma is generated in the reaction chamber and chemical vapor deposition of a diamond film on the surface of the substrate 7 is caused.

Figure 2:
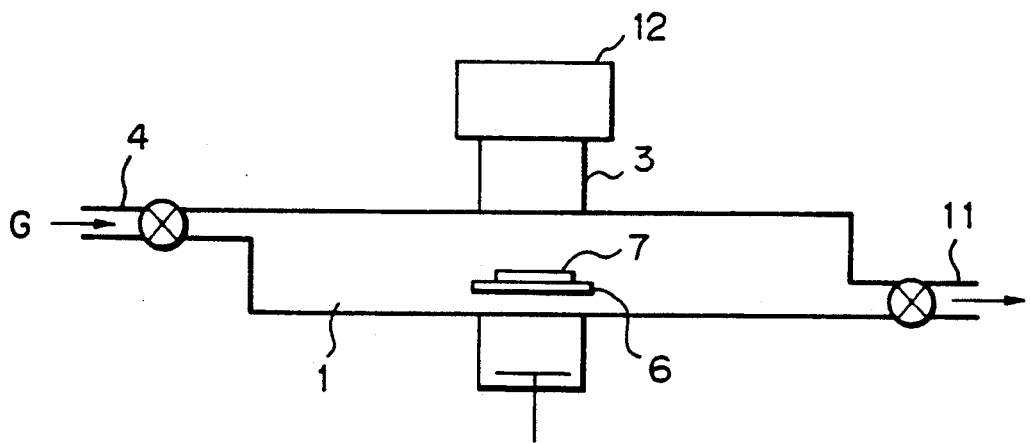
FIG. 2 is a diagram illustrating the arrangement of a microwave plasma CVD apparatus to be used for forming a diamond film according to the present invention.

In FIG. 2 illustrating the microwave plasma CVD method, the same members as in FIG. 1 are represented by the same reference numerals as used in FIG. 1. A microwave guide 3 connected to a microwave oscillator 12 is arranged in the reaction chamber 1. After the substrate 7 is placed in the reaction chamber 1 and adjusted at the above-mentioned temperature, a microwave having a frequency of 0.01 to 100 GHz is emitted to the interior of the reaction chamber 1 through the microwave guide 3, and a diamond-forming gas in which the C/H and O/C ratios are adjusted within the above-mentioned ranges is introduced into the reaction chamber 1 through the gas-introducing tube 4 to maintain the above-mentioned pressure in the reaction chamber 1, whereby a plasma is generated in the reaction chamber 1 and a diamond film is deposited on the surface of the substrate 7.

Figure 3:
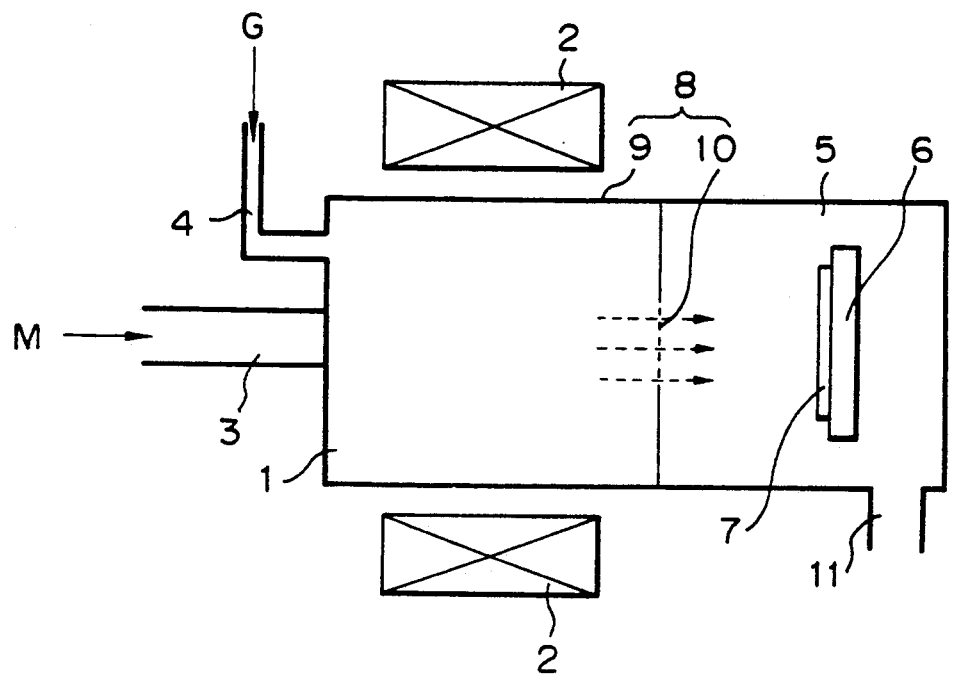
FIG. 3 is a diagram illustrating the arrangement of an electron cyclotron resonance (ECR) plasma CVD apparatus to be used for forming a diamond film according to the present invention.

In FIG. 3 illustrating the electron cyclotron resonance (ECR) plasma CVD method, the same members as in FIGS. 1 and 2 are represented by the same reference numerals as used in FIGS. 1 and 2.

The apparatus comprises as main members a reaction chamber 1, a precipitating chamber 5 and a porous bias electrode 10 separating both the chambers 1 and 5 from each other. A microwave guide 3 is connected to the reaction chamber 1 and a coil 2 for an electromagnet is arranged on the periphery of the chamber 1. A substrate 7 supported on a sample stand 6 is placed in the precipitating chamber 5 so that the substrate 7 confronts the bias electrode 10. An ion accelerating electrode 8 comprises an earthing electrode 9 on the inner wall of the reaction chamber 1 and the bias voltage 10 electrically insulated from the earthing electrode 9.

A magnetic field is generated in the reaction chamber 1 by the coil 2 and a microwave having a frequency of 0.1 to 100 GHz is applied through the microwave guide 3. The above-mentioned diamond-forming gas G is introduced into the reaction chamber 1 through the gas-introducing tube 4 to adjust the pressure in the reaction chamber 1 within the above-mentioned range. Thus, electron cyclotron resonance is generated and the electron impinges against the gas to generate a plasma. Namely, the electron causes a cyclotron motion based on the cyclotron frequency f, which is represented by the formula of $f = eB/2\pi m$ in which m stands for the mass of the electron, e stands for the charge of the electron and B stands for the magnetic flux density, and resonance is caused when the frequency f is in agreement with the frequency of the microwave. As the result, the life of the electron is prolonged and the electron impinges against the gas, and the discharge phenomenon becomes prominent and the ionization ratio in the plasma is further increased, whereby a plasma of a high purity is generated and the ion density can be increased.

By applying a negative bias voltage to the bias electrode 10, the positive ion of the plasma is accelerated and the substrate 7 is irradiated with ion beams, whereby deposite and growth of a diamond film are effected. It is preferred that the bias voltage be 50 to 5000 V, especially 200 to 1000 V.

In the present invention, it is preferred that the diamond-forming gas (reaction gas) be activated by the above-mentioned plasma discharge. However, in the present invention, the reaction gas can be activated by thermionic emission. This method is called electron irradiation CVD, thermion irradiation CVD or electron beam irradiation CVD.

Figure 4:
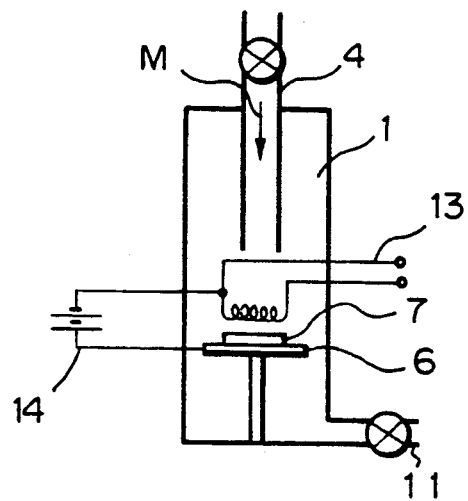
FIG. 4 is a diagram illustrating the arrangement of a thermionic emission CVD apparatus to be used for forming a diamond film according to the present invention.

Referring to FIG. 4 illustrating this thermionic emission CVD method, a heating filament 13 tungsten is arranged in a reaction chamber 1, and a diamond-forming gas is introduced into the reaction chamber 1 through a gas-introducing tube 4 to maintain a predetermined gas pressure in the reaction chamber 1. The diamond-forming gas is irradiated with a thermion emitted from the filament 13 heated at a temperature of 1000° to 2500° C., and is activated and decomposed. By this decomposition, the vapor deposition of a diamond on a substrate 7 is caused. There may be adopted a so-called electron assist CVD method in which a bias voltage is applied between the filament 13 and the substrate 7 by a power source 14 (the side of the substrate 7 is the positive side).

As the substrate, there can be mentioned oxide ceramics such as alumina, zirconia, titania and silica, carbide ceramics such as boron carbide, silicon carbide, titanium carbide and zirconium carbide, nitride ceramics such as boron nitride, titanium nitride and silicon nitride, boride ceramics such as silicon boride and titanium boride, silicon single crystal, and various metals and alloys.

The present invention is especially advantageous for the production of a diamond-covered cutting tool.

When a diamond film having a high purity is prepared, it is important that the material of a tool base to be used should be selected so that peeling of the film by the difference of the thermal expansion at the formation of the diamond film is prevented. Accordingly, it is important that a tool base having an average linear thermal expansion coefficient of $2.8 \times 10^{-6}$ to $6.0 \times 10^{-6}/°$ C., especially $3.5 \times 10^{-6}$ to $5.0 \times 10^{-6}/°$ C., at temperatures of from room temperature to 800° C. should be used. It is preferred that the difference of the thermal expansion coefficient between the formed diamond film and the substrate be smaller than $2.0 \times 10^{-6}/°$ C. If this structure is adopted, accumulation of the residual stress in the diamond film can be reduced, and even if the thickness of the diamond film is large, occurrence of chipping or peeling can be prevented. Since the film-forming operation is thus stabilized, a very uniform film can be formed and the strength of the film can be improved.

As preferred examples of the tool base, there can be mentioned super-hard sintered bodies of cermet, zirconia, silicon nitride and silicon carbide. In view of the adhesion, a silicon nitride sintered body is preferred.

A known silicon nitride sintered body can be used. More specifically, there can be used sintered bodies obtained by adding a sintering aid composed mainly of an oxide, nitride or carbide of an element of Group IIIa of the Periodic Table to silicon nitride and subjecting the mixture to hot press sintering, pressureless sintering, gas pressure sintering or hot isostatic pressure sintering.

The thermal expansion coefficient can be adjusted by an additive such as a sintering aid. For example, in case of a silicon nitride sintered body, the thermal expansion coefficient can be adjusted by addition of TiN, TiC, ZrN, SiC, $ZrO_2$, $Al_2O_3$ or the like.

In view of the cutting property, it is preferred that the thickness of the diamond film be 1 to 250 $\mu$m, especially 20 to 200 $\mu$m. In case of a cutting tool, it is preferred that the thickness of the diamond film be 1 to 200 $\mu$m, especially 20 to 100 $\mu$m.

Figure 5:
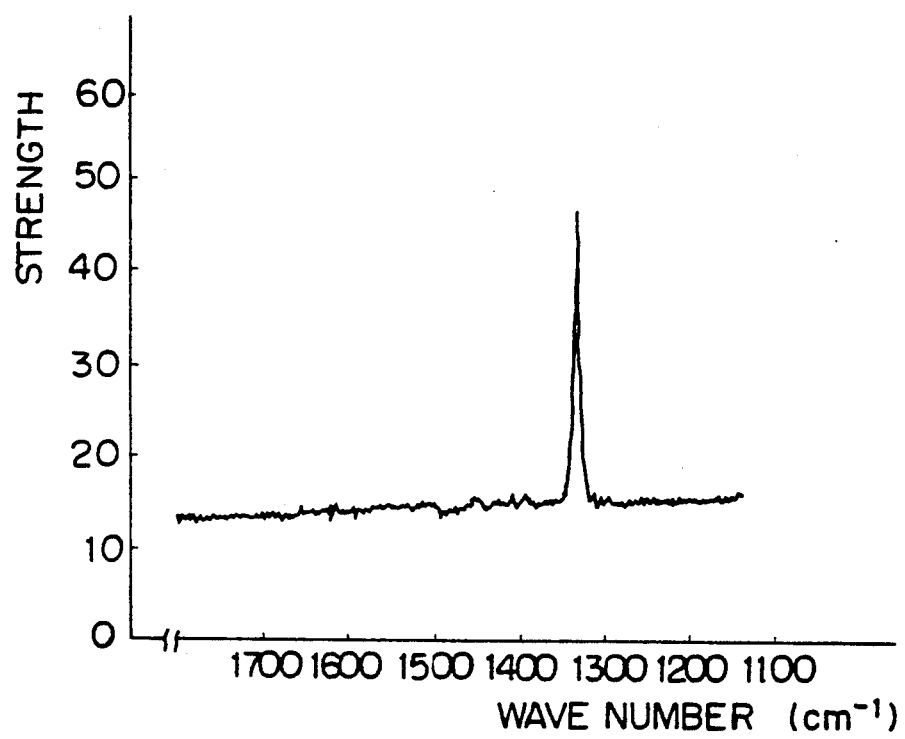
FIGS. 5 and 6 are spectrum diagrams obtained by the laser Raman spectroscopic analysis of diamond-covered tools of the present invention (runs 6 and 19 of Example 9).

FIG. 5 illustrates the spectrum obtained by the laser Raman spectroscopic analysis of the diamond film formed on the tool base according to the present invention. As is apparent from the spectrum shown in FIG. 5, an absorption of diamond is observed at 1330 cm$^{-1}$ and microscopic absorptions are observed in a surrounding area of a wave number of 1000 to 1800 cm$^{-1}$. These microscopic absorptions are attributed to amorphous carbon or graphite in the diamond film. This amorphous carbon or graphite is present in the grain boundary and surface of diamond crystal grains. If amorphous carbon or graphite is present in the grain boundary, the bonding strength among diamond crystal grains is reduced. Furthermore, since amorphous carbon or graphite is much inferior to diamond in the abrasion resistance, diamond present in the grain boundary or in the vicinity thereof is easily worn away. However, if amorphous carbon or graphite is not present in the grain boundary, the bonding strength among diamond crystal grains is high and microscopic defects of crystal grains are hardly formed, with the result that the abrasion resistance is improved.

The diamond film formed on the tool base according to the present invention is characterized in that the ratio of the spectrum area of absorptions at the wave number of 1000–1800 cm$^{-1}$ other than the absorption of diamond to the spectrum area of the absorption of diamond at a wave number of 1330 cm$^{-1}$ is smaller than 10, especially smaller than 5.

The fact that this area ratio is smaller than 10 means that the formed diamond film has a high purity and a good quality, and the inherent high abrasion resistance of diamond is manifested. If the above-mentioned area ratio exceeds 10, impurities such as amorphous carbon and graphite are included in the grain boundary, with the result that the abrasion resistance is degraded and the lift becomes short.

The present invention will now be described in detail with reference to the following examples that by no means limit the scope of the invention.

EXAMPLE 1

Diamond films were prepared from diamond-forming gases shown in Table 1 according to the high frequency plasma CVD method, the microwave plasma CVD method or the ECR plasma CVD method.

High Frequency Plasma CVD Method

A high frequency current coil was wound in 4 turns on the outside of a quartz tube as the reaction chamber, and a substrate placed in the quartz tube was adjusted to a predetermined temperature. According to the high frequency plasma CVD method, a high frequency current of 13.56 MHz was caused to flow through the coil, and a diamond-forming gas shown in Table 1 (runs 1 and 2) was introduced into the quartz tube to maintain a predetermined gas pressure, whereby a plasma was generated.

With respect to each of the obtained diamond films, the deposition speed was measured by a scanning type electron microscope, the hardness was measured by a Vickers micro-hardness tester. The obtained results are shown in Table 1.

Microwave Plasma CVD Method

When a film was prepared by using a microwave of 2.45 GHz according to the microwave plasma CVD method shown in the FIG. 2, a diamond-forming gas shown in Table 1 (runs 3 through 14) was introduced and a plasma was generated under substrate temperature and gas pressure conditions shown in Table 1.

With respect to each of the so-obtained diamond films, the deposition speed and Vickers hardness were measured in the same manner as described above. The obtained results are shown in Table 1.

ECR Plasma CVD Method

Diamond films were formed according to the ECR plasma CVD method described hereinbefore with reference to FIG. 3. A plasma was generated by introducing a diamond-forming gas shown in Table 1 (runs 15 through 17) under substrate temperature and gas pressure conditions shown in Table 1. The frequency of the microwave was 2.45 GHz and the bias voltage was 900 V.

With respect to each of the so-obtained diamond films, the deposition speed and hardness were determined in the same manner as described above. The obtained results are shown in Table 1.

TABLE 1

| Run No. | Preparation Method | Kind and Flow Rate of Diamond-Forming Gas (parenthesized value indicates flow rate (SCCM)) | Molar Ratio of Organic Compound gas to Hydrogen Gas | Substrate Temperature (°C.) | Gas Pressure (Torr) | (C)/(H) | (O)/(C) | Deposition Speed (μm/hr) | Vickers Hardness Hv (kg/mm$^2$) |
|---|---|---|---|---|---|---|---|---|---|
| 1 | high frequency plasma CVD | $H_2$(200), $C_2H_6O$(2) | 0.01 | 950 | 10 | 0.0097 | 0.5 | 1.4 | 7800 |
| 2* | high frequency plasma CVD | $H_2$(200), $CH_4$(4) | 0.02 | 950 | 10 | — | — | 0.12 | 4100 |
| 3 | microwave plasma CVD | $H_2$(100) $C_2H_6O$(20) | 0.2 | 1000 | 100 | 0.125 | 0.5 | 1.0 | 9500 |
| 4 | microwave plasma CVD | $H_2$(100) $CH_3OH$(0.05) | 0.005 | 950 | 70 | 0.0003 | 1 | 0.4 | 9900 |
| 5 | microwave plasma CVD | $H_2$(100) $CH_3OH$(0.1) | 0.001 | 950 | 70 | 0.0005 | 1 | 1.1 | 10500 |
| 6 | microwave plasma CVD | $H_2$(100) $CH_3OH$(0.5) | 0.005 | 950 | 70 | 0.0024 | 1 | 1.6 | 11200 |
| 7 | microwave plasma CVD | $H_2$(100) $CH_3OH$(10) | 0.1 | 950 | 70 | 0.0417 | 1 | 3.5 | 10800 |
| 8 | microwave plasma CVD | $H_2$(100) $CH_3$(50) | 0.5 | 950 | 70 | 0.125 | 1 | 4.4 | 8900 |
| 9 | microwave plasma CVD | $H_2$(100) $CH_3OH$(70) | 0.7 | 950 | 70 | 0.1458 | 1 | 6.9 | 4200 |
| 10 | microwave plasma CVD | $H_2$(100) $C_2H_5OH$(50) | 0.5 | 1000 | 50 | 0.2222 | 0.5 | 3.8 | 8800 |
| 11 | microwave plasma CVD | $H_2$(100) $CH_3COOH$(0.02) | 0.0002 | 1000 | 70 | 0.0002 | 1 | 1.2 | 8100 |
| 12 | microwave plasma CVD | $H_2$(100) $CH_3COOH$(5) | 0.05 | 900 | 30 | 0.0455 | 1 | 4.2 | 9400 |
| 13* | microwave plasma CVD | $H_2$(100), $CH_4$(5) | 0.05 | 1000 | 50 | — | — | 0.4 | 6700 |
| 14* | microwave plasma CVD | $CH_4$(100) | — | 950 | 70 | — | — | no diamond was formed | |
| 15 | ECR plasma CVD | $H_2$(50), $C_2H_6O$(10) Ar(20) | 0.2 | 900 | $1 \times 10^{-5}$ | 0.125 | 0.5 | 1.7 | 8400 |
| 16 | ECR plasma CVD | $H_2$(50), $C_2H_6O$(5) | 0.1 | 1000 | $6 \times 10^{-4}$ | 0.0769 | 0.5 | 5.0 | 11400 |
| 17* | ECR plasma CVD | $H_2$(45), $CH_4$(5) | 0.11 | 900 | $2 \times 10^{-4}$ | — | — | 0.6 | 6500 |

Note *outside the scope of the present invention

The following can be seen from the results shown in Table 1.

In case of the high frequency plasma CVD method, in run 1 according to the present invention, the deposition speed and the hardness of the obtained film are much higher than in run 2 outside the scope of the present invention. Therefore, it is obvious that a diamond film having a high quality can be obtained according to the present invention.

In case of the microwave plasma CVD method, in runs 3 through 8 and 10 through 12 according to the present invention, the deposition speed and hardness are much higher than in runs 13 and 14 outside the scope of the present invention, and in run 9, the deposition speed is especially high.

In case of the ECR plasma CVD method, in runs 15 and 16 according to the present invention, the deposition speed and hardness are higher than in run 17 outside the scope of the present invention.

EXAMPLE 2

Diamond films were prepared according to the high frequency plasma CVD method in the same manner as described in Example 1 except that diamond-forming gases shown in Table 2 were used.

The obtained results are shown in Table 4.

TABLE 2

| Run No. | Kind and Flow Rate of Diamond-Forming Gas (parenthesized value indicates flow rate (SCCM)) | Preparation Conditions | | | | | | | Vickers Hardness Hv (kg/mm$^2$) |
|---|---|---|---|---|---|---|---|---|---|
| | | Molar Ratio of CH$_4$ Gas to H$_2$ Gas | (C)/(H) | Molar Ratio of Oxygen-Containing to CH$_4$ Gas | (O)/(C) | Substrate Temperature (°C.) | Gas Pressure (Torr) | Deposition Speed ($\mu$m/hr) | |
| 1 | H$_2$(200), CH$_4$(1), O$_2$(0.01) | 0.005 | 0.0025 | 0.01 | 0.02 | 950 | 10 | 1.1 | 8200 |
| 2 | H$_2$(200), CH$_4$(1), O$_2$(0.1) | 0.005 | 0.0025 | 0.1 | 0.2 | 950 | 5 | 2.4 | 8500 |
| 3 | H$_2$(200), CH$_4$(5), O$_2$(0.1) | 0.025 | 0.0119 | 0.02 | 0.04 | 1400 | 5 | 2.8 | 7200 |
| 4 | H$_2$(200), Ar(40), CH$_4$(5), O$_2$(1) | 0.025 | 0.0119 | 0.2 | 0.2 | 900 | 5 | 4.9 | 8900 |
| 5 | H$_2$(200), CH$_4$(5), CO(0.001) | 0.025 | 0.0119 | 0.0002 | 0.002 | 900 | 5 | 3.5 | 8800 |
| 6* | H$_2$(200), CH$_4$(1) | 0.005 | — | — | — | 950 | 5 | 0.1 | 5900 |
| 7* | H$_2$(200), CH$_4$(5) | 0.025 | — | — | — | 900 | 5 | 0.1 | 3800 |

Note *outside the scope of the present invention

As is seen from the results shown in Table 2, in runs 1 through 5 according to the present invention, the deposition speed and hardness are very high outside the scope of the present invention. It is obvious that a diamond film having a high quality can be obtained according to the present invention.

EXAMPLE 3

Diamond films were prepared according to the microwave plasma CVD method in the same manner as described in Example 1 except that diamond-forming gases shown in Table 3 were used.

The obtained results are shown in Table 3.

From the results shown in Table 3, it is seen that according to the present invention (runs 8 through 12), the deposition speed and hardness are prominently increased. Incidentally, in run 14, diamond is not precipitated in the form of a uniform film, but diamond is grown in the granular form while a part of the substrate surface is left exposed.

EXAMPLE 4

Diamond films were formed according to the ECR plasma CVD method in the same manner as described in Example 1 except that diamond-forming gases shown in Table 4 were used.

TABLE 3

| Run No. | Kind and Flow Rate of Diamond-Forming Gas (parenthesized value indicates flow rate (SCCM)) | Preparation Conditions | | | | | | | Vickers Hardness Hv (kg/mm$^2$) |
|---|---|---|---|---|---|---|---|---|---|
| | | Molar Ratio of Hydrocarbon Gas to H$_2$ Gas | (C)/(H) | Molar Ratio of Oxygen-Containing Gas to Hydrocarbon Gas | (O)/(C) | Substrate Temperature (°C.) | Gas Pressure (Torr) | Deposition Speed ($\mu$m/hr) | |
| 8 | H$_2$(50), CH$_4$(0.25), O$_2$(0.05) | 0.005 | 0.0025 | 0.2 | 0.4 | 900 | 30 | 2.7 | 10500 |
| 9 | H$_2$(100), CH$_4$(0.5), O$_2$(0.5) | 0.005 | 0.0025 | 1 | 2 | 950 | 100 | 4.3 | 9300 |
| 10 | H$_2$(50), CH$_4$(0.25), CO(0.05) | 0.005 | 0.0030 | 0.2 | 0.1667 | 950 | 30 | 10.5 | 11800 |
| 11 | H$_2$(50), CH$_4$(0.25), CO(0.5) | 0.005 | 0.0074 | 2 | 0.6667 | 950 | 30 | 49.6 | 9900 |
| 12 | H$_2$(50), C$_2$H$_2$(0.25), O$_2$(0.1) | 0.005 | 0.0050 | 0.4 | 0.4 | 900 | 30 | 3.9 | 9000 |
| 13* | H$_2$(50), CH$_4$(0.25) | 0.005 | — | — | — | 900 | 30 | 0.3 | 5200 |
| 14* | H$_2$(100), CH$_4$(0.5) | 0.005 | — | — | — | 950 | 100 | (granular) | — |

Note *outside the scope of the present invention

The obtained results are shown in Table 4.

TABLE 4

| Run No. | Kind and Flow Rate of Diamond-Forming Gas (parenthesized Value indicates flow rate (SCCM)) | Preparation Conditions | | | | | | | Vickers Hardness Hv (kg/mm$^2$) |
|---|---|---|---|---|---|---|---|---|---|
| | | Molar Ratio of Hydrocarbon Gas to H$_2$ Gas | (H)/(C) | Molar Ratio of Oxygen-Containing Gas to Hydrocarbon Gas | (O)/(C) | Substrate Temperature (°C.) | Gas Pressure (Torr) | Deposition Speed ($\mu$m/hr) | |
| 15 | H$_2$(100), CH$_4$(50), O$_2$(5) | 0.5 | 0.125 | 0.1 | 0.2 | 800 | $2 \times 10^{-5}$ | 2.4 | 8000 |
| 16 | H$_2$(100), CH$_4$(5), O$_2$(0.5) | 0.05 | 0.0227 | 0.1 | 0.2 | 800 | $2 \times 10^{-5}$ | 4.0 | 12100 |
| 17 | H$_2$(100), CH$_4$(5), NO$_2$(5) | 0.05 | 0.0227 | 1 | 0.2 | 400 | $2 \times 10^{-4}$ | 3.2 | 8100 |
| 18 | H$_2$(100), CH$_4$(0.05), CO(0.05) | 0.0005 | 0.0005 | 1 | 0.5 | 850 | $10^{-3}$ | 1.2 | 8200 |
| 19 | H$_2$(100), CH$_4$(5), CO$_2$(0.5) | 0.05 | 0.025 | 0.1 | 0.1818 | 950 | $6 \times 10^{-4}$ | 3.3 | 8700 |
| 20 | H$_2$(100), CH$_4$(5), | 0.05 | 0.0455 | 1 | 1 | 950 | $6 \times 10^{-4}$ | 5.8 | 9600 |

TABLE 4-continued

| Run No. | Kind and Flow Rate of Diamond-Forming Gas (parenthesized Value indicates flow rate (SCCM)) | Preparation Conditions | | | | | | | |
|---|---|---|---|---|---|---|---|---|---|
| | | Molar Ratio of Hydrocarbon Gas to $H_2$ Gas | (H)/(C) | Molar Ratio of Oxygen-Containing Gas to Hydrocarbon Gas | (O)/(C) | Substrate Temperature (°C.) | Gas Pressure (Torr) | Deposition Speed (μm/hr) | Vickers Hardness Hv (kg/mm²) |
| 21 | $H_2(100)$, $CH_4(10)$, $CO_2(5)$ $H_2O(1)$ | 0.1 | 0.0413 | 0.1 | 0.1 | 900 | $2 \times 10^{-4}$ | 2.8 | 8600 |
| 22 | $H_2(100)$, $CH_4(10)$, $H_2O(5)$ | 0.1 | 0.04 | 0.5 | 0.5 | 900 | $2 \times 10^{-4}$ | 8.6 | 9100 |
| 23 | $H_2(200)$, $C_3H_8(8)$, $O_2(0.1)$ | 0.005 | 0.0909 | 0.1 | 0.0083 | 800 | $3 \times 10^{-4}$ | 2.3 | 8800 |
| 24 | $H_2(100)$, $C_2H_2(3)$, $O_2(0.1)$ | 0.03 | 0.0291 | 0.03 | 0.0333 | 800 | $3 \times 10^{-4}$ | 3.0 | 8500 |
| 25 | $H_2(100)$, $C_2H_4(3)$, $O_2(0.1)$ | 0.03 | 0.0283 | 0.03 | 0.0333 | 800 | $3 \times 10^{-4}$ | 3.4 | 8900 |
| 26 | $H_2(100)$, $CH_4(5)$ | 0.05 | — | — | — | 900 | $2 \times 10^{-4}$ | 0.2 | 5200 |
| 27 | $H_2(45)$, $CH_4(5)$ | 0.11 | — | — | — | 900 | $2 \times 10^{-4}$ | 0.6 | 6500 |

Note *outside the scope of the present invention

As is apparent from the results shown in Table 4, according to the present invention (runs 15 through 25), the deposition speed and hardness are prominently increased.

EXAMPLE 5

Diamond films were formed according to the high frequency plasma CVD method, the microwave plasma CVD method or the ECR plasma CVD method in the same manner as described in Example 1 except that diamond-forming gases shown in Table 5 were used.

Incidentally, in runs 14, 16, 25 and 29, diamond films were formed according to the thermionic emission CVD method illustrated in FIG. 4 (the tungsten filament temperature was adjusted to 800° C.).

The obtained results are shown in Table 5.

TABLE 5

| Run[1] No. | Film-Forming Method | Diamond-Forming Gas[2] | Pressure (Torr) | (C)/(H) | (O)/(C) | Deposition Speed (μm/hr) | Vickers Hardness Hv |
|---|---|---|---|---|---|---|---|
| 1 | microwave CVD | $H_2$ + $CH_4$ + $CH_3OH$ (200) (0.02) (0.02) | 75 | 0.0001 | 0.5 | 0.5 | 6000 |
| 2 | microwave CVD | $H_2$ + $CH_4$ + $CH_3OH$ (100) (0.03) (0.02) | 75 | 0.0003 | 0.4 | 0.8 | 8100 |
| 3 | microwave CVD | $H_2$ + $CH_4$ + $CH_3OH$ (100) (0.07) (0.03) | 75 | 0.0005 | 0.3 | 1.3 | 9000 |
| 4 | microwave CVD | $H_2$ + $CH_4$ + $CH_3OH$ (100) (2.8) (0.2) | 75 | 0.0142 | 0.067 | 3.2 | 11200 |
| 5 | microwave CVD | $H_2$ + $CH_4$ + $CH_3OH$ (100) (4) (8) | 75 | 0.048 | 0.67 | 4.9 | 10500 |
| 6 | microwave CVD | $H_2$ + $CH_4$ + $CH_3OH$ (100) (4) (40) | 75 | 0.1170 | 0.91 | 6.4 | 9700 |
| 7 | microwave CVD | $H_2$ + $CH_4$ + $CH_3OH$ (100) (5) (95) | 75 | 0.1667 | 0.95 | 7.7 | 8500 |
| 8 | microwave CVD | $H_2$ + $CH_4$ + $CH_3OH$ (100) (10) (120) | 75 | 0.1806 | 0.92 | 10.5 | 7700 |
| 9 | high frequency CVD | $H_2$ + $CH_4$ + $CH_3OH$ (100) (0.5) (0.02) | 15 | 0.0026 | 0.038 | 2.3 | 8600 |
| 10 | high frequency CVD | $H_2$ + $CH_4$ + $CH_3OH$ (200) (10) (0.01) | 15 | 0.0227 | 0.001 | 0.8 | 8600 |
| 11 | high frequency CVD | $H_2$ + $CH_4$ + $CH_3OH$ (100) (10) (10) | 15 | 0.0714 | 0.5 | 6.6 | 9100 |
| 12 | microwave CVD | $H_2$ + $C_3H_8$ + $CH_3COCH_3$ (200) (1) (2) | 30 | 0.0214 | 0.22 | 2.0 | 8800 |
| 13 | ECR CVP | $H_2$ + $CH_4$ + $CH_3OH$ (50) (2) (3) | $10^{-4}$ | 0.0417 | 0.6 | 5.2 | 11700 |
| 14 | thermionic emission CVD | $H_2$ + $C_2H_2$ + $CH_3OH$ (200) (1) (2) | 300 | 0.0098 | 0.5 | 6.9 | 9300 |
| 15 | high frequency CVD | $H_2$ + $CH_4$ + $CH_3OCH_3$ (100) (5) (2) | 15 | 0.0388 | 0.22 | 3.1 | 9100 |
| 16 | thermionic emission CVD | $H_2$ + $C_2H_2$ + $CH_3CHO$ (100) (2) (2) | 50 | 0.0377 | 0.25 | 2.4 | 9500 |
| 17 | microwave CVD | $H_2$ + $C_2H_2$ + $CH_3COOCH_3$ + $O_2$ (100) (5) (5) (20) | 100 | 0.1042 | 1 | 7.4 | 10100 |
| 18 | microwave CVD | $H_2$ + $C_2H_2$ + $CH_3COOCH_3$ + CO (100) (1) (5) (1) | 100 | 0.0776 | 0.61 | 5.5 | 11000 |
| 19 | microwave CVD | $H_2$ + $C_2H_4$ + $CH_3CHO$ + $NO_2$ (100) (3) (5) (10) | 100 | 0.0690 | 0.94 | 5.2 | 9900 |
| 20 | microwave CVD | $H_2$ + $C_2H_4$ + $C_2H_5OC_2H_5$ + $H_2O$ (100) (1) (1) (3) | 100 | 0.0273 | 0.67 | 4.1 | 9100 |
| 21 | microwave CVD | $H_2$ + $C_2H_4$ + $C_2H_5OC_2H_5$ + $O_2$ (100) (1) (1) (3) | 100 | 0.28 | 1.2 | 3.6 | 10500 |
| 22 | microwave | $H_2$ + $C_2H_4$ + $C_2H_5OC_2H_5$ + $O_2$ | 100 | 0.28 | 3.8 | 1.3 | 9800 |

TABLE 5-continued

| Run[1] No. | Film-Forming Method | Diamond-Forming Gas[2] | Pressure (Torr) | (C)/(H) | (O)/(C) | Deposition Speed (μm/hr) | Vickers Hardness Hv |
|---|---|---|---|---|---|---|---|
| | CVD | (100) (1) (1) (11) | | | | | |
| 23 | microwave CVD | $H_2 + C_2H_4 + C_2H_5OC_2H_5 + O_2$ (100) (1) (1) (17) | 100 | 0.28 | 5.8 | 0.7 | 9500 |
| 24 | ECR CVD | $H_2 + CH_4 + CH_3COOCH_3 + O_2$ (50) (1) (5) (1) | $10^{-4}$ | 0.1194 | 0.75 | 7.1 | 10300 |
| 25 | thermionic emission CVD | $H_2 + CH_4 + CH_3COOCH_3 + H_2O$ (200) (1) (3) (1) | 30 | 0.0236 | 0.7 | 11.0 | 8800 |
| 26* | high frequency CVD | $H_2 + CH_4$ (200) (4) | 10 | 0.0096 | 0 | 0.1 | 4100 |
| 27 | microwave CVD | $H_2 + C_3H_8 + CH_3COCH_3 + O_2$ (200) (3) (3) (5) | 30 | 0.0407 | 0.72 | 4.8 | 9900 |
| 28 | high frequency CVD | $H_2 + CH_4 + CH_3OCH_3 + O_2$ (100) (10) (3) (4) | 15 | 0.0620 | 0.69 | 5.4 | 9400 |
| 29 | thermionic emission CVD | $H_2 + C_2H_2 + CH_3CHO + H_2O$ (100) (4) (5) (10) | 50 | 0.0726 | 0.88 | 7.1 | 9700 |

Note
[1] Each asterisk indicates a comparative run outside the scope of the present invention.
[2] Each parenthesized value indicates the flow rate (SCCM) of the gas.

The following can be seen from the results shown in Table 5.

According to the conventional method using a diamond-forming gas comprising hydrogen and a hydrocarbon (run 26), the deposition speed is 0.1 μm/hr and the Vickers hardness is 4100. On the other hand, in each of runs according to the present invention, the deposition speed is higher than 0.5 μm/hr and the Vickers hardness is higher than 6000. Especially, in runs 3 through 25 and 27 through 29 in which the (C)/(H) ratio is 0.0005 to 2 and the (O)/(C) ratio is 0.0005 to 4, the deposition speed is higher than 0.8 μm/hr and the Vickers hardness is higher than 8800. The effect by addition of the oxygen-containing gas becomes obvious by comparing runs 12, 15 and 16 with runs 27, 28 and 29, respectively. Namely, $((O)/(C))_{max}$ is 0.33 in run 12, 0.5 in run 15 or 0.5 in run 16, the value can be increased by addition of the oxygen-containing gas, whereby the deposition speed and Vickers hardness can be increased.

EXAMPLE 6

Diamond films were formed in the same manner as described in Example 1 except that diamond-forming gases shown in Table 6 were used.

The obtained results are shown in Table 6.

TABLE 6

| Run[1] No. | Film-Forming Method | Diamond-Forming Gas[2] | Pressure (Torr) | (C)/(H) | (O)/(C) | Deposition Speed (μm/hr) | Vickers Hardness Hv |
|---|---|---|---|---|---|---|---|
| 1 | microwave CVD | $H_2 + CH_4$ (100) (5) | 50 | 0.0227 | 0 | 0.4 | 6700 |
| 2 | " | $H_2 + C_2H_5OH + NO$ (200) (0.04) (0.02) | 50 | 0.0003 | 0.075 | 0.5 | 7100 |
| 3 | " | $H_2 + C_2H_5OH + NO$ (200) (0.1) (0.02) | 50 | 0.0005 | 0.6 | 1.1 | 8200 |
| 4 | " | $H_2 + C_3H_6OH + NO$ (200) (1) (0.02) | 50 | 0.0074 | 0.340 | 2.6 | 8400 |
| 5 | " | $H_2 + C_4H_9OH + O_2$ (200) (4) (6) | 50 | 0.0364 | 1 | 5.2 | 9300 |
| 6 | " | $H_2 + CH_3OH + O_2$ (100) (50) (30) | 50 | 0.125 | 2.2 | 3.3 | 8100 |
| 7 | " | $H_2 + CH_3OH + O_2$ (10) (100) (100) | 50 | 0.2381 | 3 | 1.6 | 7800 |
| 8 | high frequency | $H_2 + CH_3COOCH_3 + H_2O$ (100) (7) (5) | 10 | 0.0833 | 0.905 | 6.2 | 10200 |
| 9 | high frequency | $H_2 + CH_3COCH_3 + O_2$ (100) (2) (14) | 20 | 0.0283 | 5 | 0.6 | 8900 |
| 10 | ECR CVD | $H_2 + CH_3CHO + H_2O_2$ (50) (3) (1) | $10^{-4}$ | 0.0526 | 0.833 | 4.8 | 9200 |
| 11 | " | $H_2 + CH_3OCH_3 + CO$ (50) (3) (1) | $10^{-4}$ | 0.0508 | 0.571 | 7.3 | 10500 |
| 12 | " | $H_2 + C_2H_5OC_2H_5 + H_2O$ (200) (3) (7) | $10^{-4}$ | 0.0270 | 0.833 | 7.4 | 9700 |

Note
[1] Each asterisk indicates a comparative run outside the scope of the present invention.
[2] Each parenthesized value indicates the flow rate (SCCM) of the gas.

From the results shown in Table 6, the following can be seen.

According to the conventional method using a diamond-forming gas comprising hydrogen and a hydrocarbon (run 1), the deposition speed 0.4 μm/hr and the Vickers hardness is 6700. On the other hand, according to the present invention (runs 2 through 12), both the deposition speed and hardness are higher. In the case where the (C)/(H) ratio is 0.005 to 2 and the (O)/(C) ratio is 0.0005 to 4 (runs 3 through 12), a deposition speed higher than 1 μm/hr and a Vickers hardness higher than 7500 can be attained.

EXAMPLE 7

Diamond films were formed on tool bases (form: TPGN 322) shown in Table 7 according to the microwave plasma CVD method, the high frequency plasma CVD method or the ECR plasma CVD method.

Microwave Plasma CVD Method

According to the microwave plasma CVD method illustrated hereinbefore with reference to FIG. 2, a diamond film was formed by using a microwave of 2.45 GHz and introducing a diamond-forming gas shown in Table 7. the substrate temperature was adjusted to 900° C. and a plasma was generated under a gas pressure shown in Table 7 to form a diamond film.

High Frequency Plasma CVD Method

According to the method illustrated hereinbefore with reference to FIG 1, a high frequency current coil was wound in 4 turns on the outside of a quartz tube as the reaction chamber, and a substrate temperature was adjusted to 850° C. According to the high frequency plasma CVD method, a high frequency current of 13.56 MHz was applied to the coil and a diamond-forming gas shown in Table 7 was introduced to maintain a predetermined gas pressure, whereby a plasma was generated and a diamond film was formed.

ECR Plasma CVD Method

A diamond film was prepared according to the ECR plasma CVD method described in Example 1.

Thermionic Emission Plasma CVD Method

The thermionic emission plasma CVD method described in Example 5 was adopted. A diamond-forming gas shown in Table 7 was introduced to maintain a predetermined gas pressure.

With respect to each of the so-obtained diamond films, the deposition speed was measured by a scanning type electron microscope and the hardness was measured by a Vickers micro-hardness tester. Furthermore, the cutting test was carried out under the following conditions for 20 minutes, and the wear quantity was measured.

Cutting Test work: 18 Si-Al alloy
cutting speed: 700 m/min
depth of cut: 0.2 mm
Feed rate: 0.1 mm/rev The measurement results are shown in Table 7. Incidentally, the wear quantity was expressed by the wear width of the cutting edge.

TABLE 7

| Run No. | Tool Base | Film-Forming Method | Thermal Expansion coefficient of Base ($\times 10^{-6}/°C.$) | Diamond-Forming Gas[2] | Pressure (Torr) |
|---|---|---|---|---|---|
| 1* | $Si_3N_4$ sintered body | microwave CVD | 3.7 | $H_2 + CH_4$ (100) (3) | 30 |
| 2 | " | " | 3.7 | $H_2 + CH_4 + H_2O$ (100) (3) (2) | 30 |
| 3 | " | " | 3.7 | $H_2 + C_2H_2 + H_2O_2$ (100) (5) (4) | 30 |
| 4 | " | " | 3.7 | $H_2 + C_2H_2 + HCOOH$ (100) (5) (5) | 30 |
| 5 | " | " | 5.5 | $H_2 + C_2H_2 + O_2$ (100) (10) (10) | 50 |
| 6 | " | " | 5.5 | $H_2 + C_2H_2 + CH_3OH + CO_2$ (100) (5) (10) (10) | 50 |
| 7 | " | " | 5.5 | $H_2 + C_2H_4 + CH_3OCH_3 + O_2$ (200) (20) (10) (20) | 50 |
| 8 | cemented carbide | ECR CVD | 6.0 | $H_2 + C_3H_8 + O_2$ (50) (1) (1) | $10^{-4}$ |
| 9 | W | high frequency CVD | 4.5 | $H_2 + C_3H_8 + H_2O$ (200) (10) (20) | 10 |
| 10 | SiC sintered body | thermionic emission CVD | 4.5 | $H_2 + CH_4 + O_2$ (100) (5) (2) | 30 |
| 11* | cemented carbide | microwave CVD | 10 | $H_2 + CH_4 + H_2O$ (100) (3) (2) | 30 |
| 12 | $Si_3N_4$ sintered body | microwave CVD | 5.5 | $H_2 + CH_4 + O_2$ (100) (3) (2) | 30 |
| 13 | $Si_3N_4$ sintered body | microwave CVD | 6.8 | $H_2 + CH_4 + O_2$ (100) (3) (2) | 30 |
| 14 | $Si_3N_4$ sintered body | microwave CVD | 5.8 | $H_2 + CH_4 + O_2$ (100) (3) (2) | 30 |
| 15 | $Si_3N_4$ sintered body | microwave CVD | 3.7 | $H_2 + CH_4 + HCOOH$ (100) (4) (6) | 70 |
| 16 | " | " | 3.7 | $H_2 + C_3H_8 + (COOH)_2$ (100) (2) (5) | 70 |
| 17 | " | thermionic emission CVD | 3.7 | $H_2 + C_2H_2 + (COOH)_2$ (200) (4) (4) | 30 |
| 18 | " | high frequency CVD | 3.7 | $H_2 + C_2H_4 + CH_3COOH$ (100) (3) (6) | 10 |
| 19* | " | high frequency CVD | 2.4 | $H_2 + C_2H_4 + CH_3COOH$ (100) (3) (6) | 10 |

| Run No.[1] | (C)/(H) | (O)/(C) | Deposition Speed (μm/hr) | Thickness (μm) | Wear Quantity (mm) |
|---|---|---|---|---|---|
| 1* | 0.0142 | 0 | 0.3 | 36 | 0.16 |
| 2 | 0.0139 | 0.67 | 3.4 | 68 | 0.04 |
| 3 | 0.0459 | 0.8 | 5.5 | 55 | 0.05 |
| 4 | 0.0682 | 0.67 | 6.8 | 68 | 0.04 |
| 5 | 0.0909 | 1 | 5.7 | 57 | 0.04 |

TABLE 7-continued

| | | | | | |
|---|---|---|---|---|---|
| 6 | 0.12 | 1 | 7.2 | 72 | 0.06 |
| 7 | 0.1111 | 0.833 | 6.5 | 65 | 0.04 |
| 8 | 0.0278 | 0.67 | 3.9 | 39 | 0.05 |
| 9 | 0.0577 | 0.67 | 8.0 | 80 | 0.05 |
| 10 | 0.0227 | 0.8 | 7.6 | 76 | 0.05 |
| 11* | 0.0139 | 0.67 | ← | peeling | → |
| 12 | 0.0142 | 1.33 | 6.9 | 69 | 0.04 |
| 13* | 0.0142 | 1.33 | ← | peeling | → |
| 14 | 0.0142 | 1.33 | 7.2 | 72 | 0.05 |
| 15 | 0.0439 | 1.2 | 4.1 | 82 | 0.04 |
| 16 | 0.0708 | 1.25 | 4.7 | 94 | 0.05 |
| 17 | 0.0385 | 1 | 3.6 | 72 | 0.04 |
| 18 | 0.0763 | 0.67 | 5.1 | 102 | 0.06 |
| 19* | 0.0763 | 0.67 | ← | peeling | → |

Note
[1] Each asterisk indicates a comparative run outside the scope of the present invention.
[2] Each parenthesized value indicates the flow rate (SCCM) of the gas.
[3] Each indicates an average linear expansion coefficient when the temperature of the tool base is elevated from room temperature to 800° C.

From the results shown in Table 7, the following can be seen.

According to the conventional method using a diamond-forming gas comprising hydrogen and a hydrocarbon (run 1), the deposition speed is as low as 0.3 μm/hr and the wear quantity is as large as 0.16 mm. On the other hand, according to the present invention (runs 2 through 10, 12 and 14 through 18), the deposition speed is higher than 1 μm/hr, and the wear quantity is smaller than 0.1 mm and the abrasion resistance is excellent.

However, if the thermal expansion coefficient of the tool base is smaller than $2.8 \times 10^{-6}$/° C. (run 19) or larger than $6.0 \times 10^{-6}$/° C. (runs 11 and 13), peeling of the diamond feel is caused.

EXAMPLE 8

Diamond-covered tools were prepared in the same manner as described in Example 7 except that tool bases and gases shown in Table 8 were used.

The obtained results are shown in Table 8.

TABLE 8

| Run No.[1] | Tool Base | Film-Forming Method | Thermal Expansion Coefficient of Base ($\times 10^{-6}$ °C.) | Diamond-Forming Gas[2] | Pressure (Torr) |
|---|---|---|---|---|---|
| 1* | Si$_3$N$_4$ sintered body | microwave CVD | 3.7 | H$_2$ + CH$_4$ (100) (3) | 30 |
| 2 | " | " | 3.7 | H$_2$ + CH$_3$OH (200) (0.2) | 50 |
| 3 | " | " | 3.7 | H$_2$ + CH$_3$COOCH$_3$ (100) (5) | 50 |
| 4 | " | " | 3.7 | H$_2$ + CH$_3$OH (200) (60) | 35 |
| 5 | SiC sintered body | thermionic emission CVD | 4.5 | H$_2$ + CH$_3$COOCH$_3$ (200) (5) | 200 |
| 6 | Si$_3$N$_4$ sintered body | microwave CVD | 3.7 | H$_2$ + CH$_3$COCH$_3$ (100) (1.5) | 70 |
| 7 | " | " | 3.7 | H$_2$ + C$_2$H$_5$OC$_2$H$_5$ (100) (1) | 70 |
| 8 | " | " | 3.7 | H$_2$ + CH$_3$COCH$_3$ + H$_2$O$_2$ (100) (5) (2) | 100 |
| 9 | " | " | 3.7 | H$_2$ + CH$_3$COCH$_3$ + O$_2$ (100) (3) (3) | 70 |
| 10 | " | " | 3.7 | H$_2$ + C$_2$H$_5$OC$_2$H$_5$ + H$_2$O (100) (2) (5) | 70 |
| 11 | W | high frequency CVD | 4.5 | H$_2$ + C$_2$H$_4$ + O$_2$ (100) (5) (2) | 20 |
| 12 | cemented carbide | high frequency CVD | 6 | H$_2$ + C$_2$H$_4$ + O$_2$ (100) (5) (2) | 20 |
| 13 | Si$_3$N$_4$ sintered body | high frequency CVD | 5.5 | H$_2$ + C$_2$H$_4$ + O$_2$ (100) (5) (2) | 20 |
| 14 | AlN sintered body | ECR CVD | 5.2 | H$_2$ + C$_2$H$_4$ + O$_2$ (100) (5) (2) | $2 \times 10^{-4}$ |
| 15* | Si$_3$N$_4$ sintered body | microwave CVD | 2.4 | H$_2$ + CH$_3$COCH$_3$ | 70 |
| 16* | " | " | 6.5 | " | 70 |
| 17* | cemented carbide | " | 10 | " | 70 |

| Run No.[1] | (C)/(H) | (O)/(C) | Deposition Speed (μm/hr) | Thickness (μm) | Wear Quantity (mm) |
|---|---|---|---|---|---|
| 1* | 0.0142 | 0 | 0.3 | 36 | 0.16 |
| 2 | 0.0005 | 1 | 0.8 | 8 | 0.09 |
| 3 | 0.0652 | 0.667 | 6.2 | 74 | 0.04 |
| 4 | 0.0938 | 1 | 4.6 | 55 | 0.04 |
| 5 | 0.0349 | 0.667 | 7.2 | 72 | 0.05 |
| 6 | 0.0215 | 0.33 | 2.8 | 160 | 0.06 |
| 7 | 0.0190 | 0.25 | 3.1 | 186 | 0.07 |
| 8 | 0.0427 | 0.9 | 5.5 | 55 | 0.05 |
| 9 | 0.0413 | 1 | 5.6 | 168 | 0.04 |
| 10 | 0.0348 | 0.875 | 6.3 | 195 | 0.05 |

TABLE 8-continued

| 11 | 0.0455 | 0.9 | 3.8 | 38 | 0.06 |
|---|---|---|---|---|---|
| 12 | 0.0455 | 0.9 | 3.8 | 38 | 0.05 |
| 13 | 0.0455 | 0.9 | 3.8 | 38 | 0.04 |
| 14 | 0.0455 | 0.9 | 3.8 | 38 | 0.05 |
| 15* | 0.0215 | 0.33 | ←peeling→ | | |
| 16* | 0.0215 | 0.33 | ← peeling | | → |
| 17* | 0.0215 | 0.33 | ← peeling | | → |

Note
[1] Each asterisk indicates a comparative run outside the scope of the present invention.
[2] Each parenthesized value indicates the flow rate (SCCM) of the gas.
[3] Each indicates an average linear expansion coefficient when the temperature of the tool base is elevated from room temperature to 800° C.

The following can be sen from the results shown in Table 8.

According to the conventional method using a diamond-forming gas comprising hydrogen and a hydrocarbon (run 1), the wear quantity is as large as 0.16 mm. On the other hand, according to the present invention (runs 2 through 14), the deposition speed is 0.8 μm/hr, and the wear quantity is smaller than 0.1 mm and excellent cutting properties can be attained.

In the case where the thermal expansion coefficient of the tool base is smaller than $2.8 \times 10^{-6}$/° C. (run 15) or larger than $6.0 \times 10^{-6}$/° C. (runs 16 and 17), peeling of the film is caused.

EXAMPLE 10

A tool base shown in Table 10 was arranged in a reaction chamber formed of quartz, and a diamond-forming gas having a composition shown in Table 10 was introduced and a diamond film was prepared under film-forming conditions shown in Table 9 according to a film-forming method shown in Table 9.

TABLE 9

| Film-Forming Method | Substrate Temperature (°C.) | Frequency | Pressure (Torr) |
|---|---|---|---|
| microwave plasma CVD method | 900 | 2.45 GHz | 50 |
| high frequency plasma CVD method | 850 | 13.56 MHz | 10 |
| ECR plasma CVD method | 800 | 2.45 GHz | $10^{-4}$ |
| thermionic emission CVD method | 800 | — | 30 |

As the tool base, there were used a silicon nitride sintered body having a thermal expansion coefficient of 2.4, 3.6, 3.7, 4.2, 4.3 or $6.8 \times 10^{-6}$/° C., a cemented carbide having a thermal expansion coefficient of $6.0 \times 10^{-6}$/° C., a silicon carbide sintered body having a thermal expansion coefficient of $4.5 \times 10^{-6}$/° C., an alumina sintered body having a thermal expansion coefficient of $4.5 \times 10^{-6}$/° C., a sintered body of ($Si_3N_4$+SiC) having a thermal expansion coefficient of $4.0 \times 10^{-6}$/° C. and tungsten having a thermal expansion coefficient of $3.7 \times 10^{-6}$/° C. These average linear expansion coefficients are the values when the temperature is elevated from room temperature to 800° C.

With respect to each of the obtained diamond-covered tools, a spectrum of the diamond film was determined by the laser Raman spectroscopic analysis. In the state where the spectrum attributed to the tool base was subtracted from the determined spectrum, the spectrum area of diamond in the vicinity of 1330 $cm^{-1}$ and the area of the spectrum other than the spectrum of diamond were measured, and the area ratio of the spectrum area of other than diamond to the spectrum area of diamond was calculated.

The obtained tools were subjected to the cutting test under condition of cutting Test 1 (runs 1 through 23) or under conditions of cutting Test 2 (runs 24 through 26). After the cutting test, the wear width of the diamond film on the cut edge was measured.

| | Cutting Test 1 | Cutting Test 2 |
|---|---|---|
| work | Al alloy (containing 18% of Si) | pure copper |
| cutting speed | 700 m/min | 1000 m/min |
| depth of cut | 0.2 mm | 0.5 mm |
| feed rate | 0.1 mm/rev | 0.25 mm/rev |
| cutting time | 20 minutes | 120 minutes |

Figure 6:
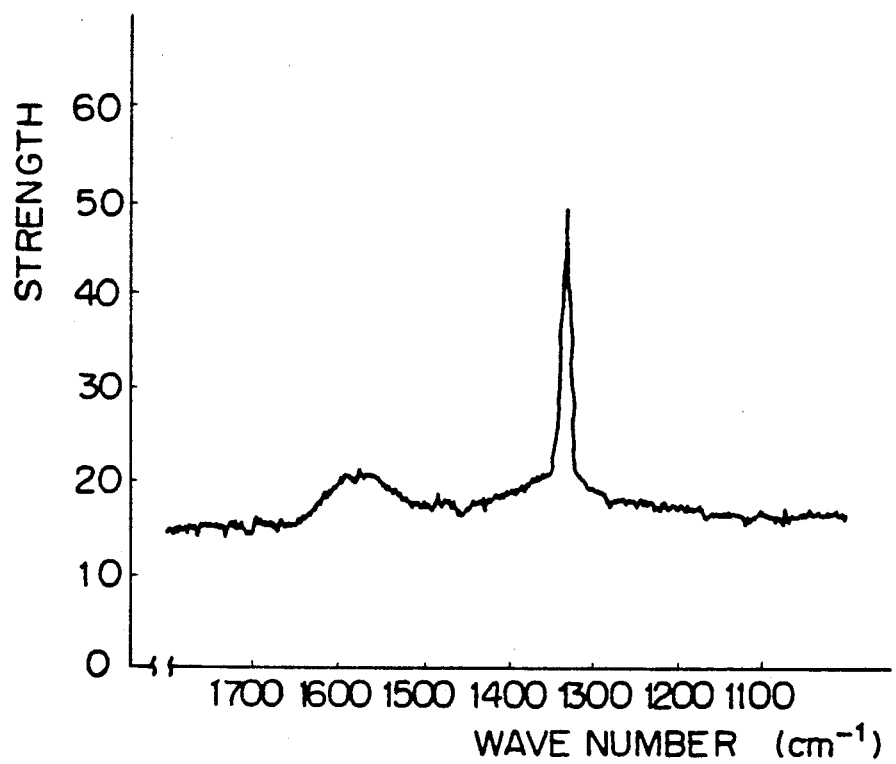
Figure 7:
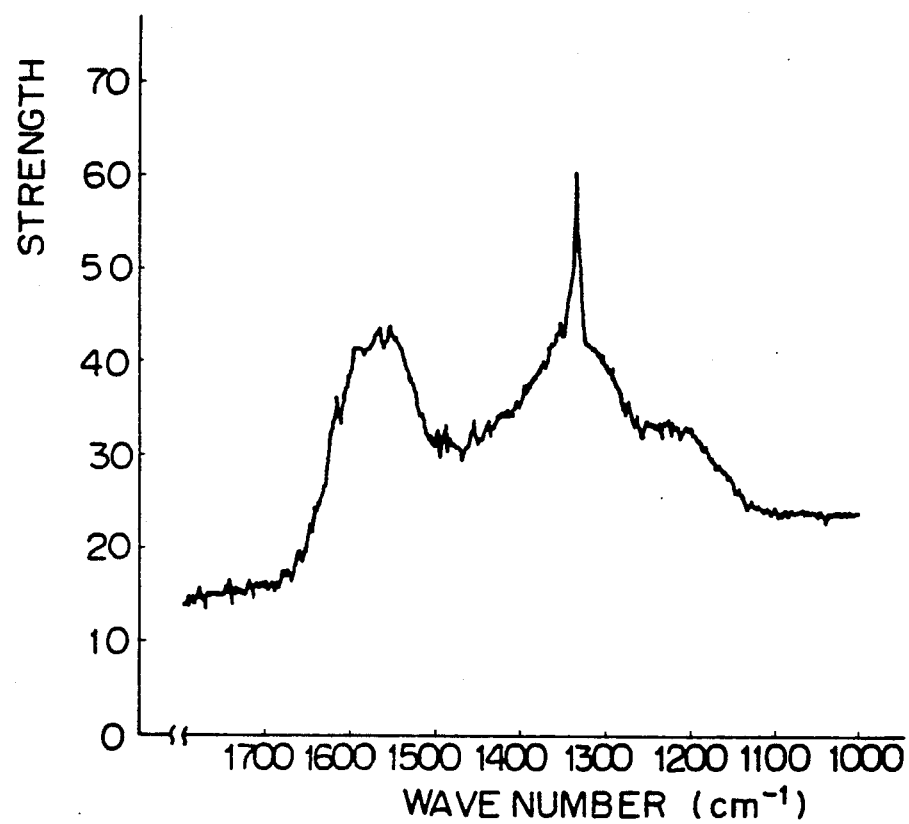
FIG. 7 is a spectrum diagram obtained by the laser Raman spectroscopic analysis of a diamond-covered tool of run 9 of Example 9.

The spectra of diamond films according to the present invention (runs 6 and 19) by the laser Raman spectroscopic analysis are shown in FIGS. 5 and 6, and the spectrum of a comparative diamond film (run No. 9) by the laser Raman spectroscopic analysis is shown in FIG. 7.

The obtained results are shown in Table 10.

TABLE 10

| Run No.[1] | Tool Base | Thermal Expansion Coefficient of Tool Base ($\times 10^{-6}$/°C.) | Film-Forming Method | Diamond-Forming Gas[2] |
|---|---|---|---|---|
| 1 | $Si_3N_4$ sintered body | 3.7 | microwave CVD | $H_2$ + $CH_3COOCH_3$ (100) (5) |
| 2 | " | 3.7 | " | $H_2$ + $CH_4$ + $CH_3OH$ (100) (5) (10) |
| 3 | " | 3.7 | " | $H_2$ + $CH_3OCH_3$ + $H_2O$ (100) (10) (10) |
| 4 | " | 3.7 | " | $H_2$ + $C_2H_5OC_2H_5$ + $O_2$ (100) (5) (10) |
| 5 | " | 3.6 | " | $H_2$ + $CH_3CHO$ + $H_2O_2$ (100) (5) (2) |
| 6 | " | 3.6 | " | $H_2$ + $CH_3COCH_3$ + $CO_3$ (100) (2) (2) |
| 7 | " | 4.2 | " | $H_2$ + $C_2H_5O$ (100) (5) |
| 8 | " | 4.2 | " | $H_2$ + $C_2H_2$ + $NO_2$ |

TABLE 10-continued

| | | | | |
|---|---|---|---|---|
| 9* | " | 4.2 | " | (100) (5)  (3)<br>H$_2$ + CH$_4$<br>(100) (3) |
| 10 | " | 3.7 | thermionic emission CVD | H$_2$ + C$_2$H$_5$OH<br>(100) (3) |
| 11 | cemented carbide | 6.0 | thermionic emission CVD | H$_2$ + C$_2$H$_4$ + O$_2$<br>(100) (5)  (3) |
| 12 | SiC sintered body | 4.5 | high frequency CVD | H$_2$ + CH$_3$OCH$_3$ + O$_2$<br>(100) (25)  (10) |
| 13 | Si$_3$N$_4$ sintered body | 4.3 | high frequency CVD | H$_2$ + CH$_3$OCH$_3$<br>(100) (4) |
| 14 | (Si$_3$N$_4$ + SiC) sintered body) | 4.0 | high frequency CVD | H$_2$ + CH$_3$OCH$_3$<br>(100) (4) |
| 15 | Al$_2$O$_3$ sintered body | 4.5 | high frequency CVD | H$_2$ + CH$_3$OCH$_3$<br>(100) (0.5) |
| 16 | Si$_3$N$_4$ sintered body | 3.7 | ECR CVD | H$_2$ + CH$_3$OCH$_3$<br>(50) (5) |
| 17 | W | 3.7 | " | H$_2$ + CH$_3$OCH$_3$<br>(100) (5) |
| 18* | Si$_3$N$_4$ | 3.7 | thermionic emission CVD | H$_2$ + CH$_4$<br>(100) (1) |
| 19 | " | 3.7 | microwave CVD | H$_2$ + C$_2$H$_2$ + CH$_3$OH + O$_2$<br>(200) (2)  (4)  (2) |
| 20 | Si$_3$N$_4$ sintered body | 3.7 | thermionic emission CVD | H$_2$ + CH$_3$COOCH$_3$<br>(200) (10) |
| 21* | " | 2.4 | microwave CVD | H$_2$ + CH$_3$COOCH$_3$<br>(100) (5) |
| 22* | " | 6.8 | " | H$_2$ + CH$_3$COOCH$_3$<br>(100) (5) |
| 23 | " | 6.8 | " | H$_2$ + CH$_4$ + C$_3$H$_7$OC$_3$H$_7$<br>(100) (10)  (0.1) |
| 24 | " | 6.8 | " | H$_2$ + CH$_3$OCH$_3$<br>(100) (5) |
| 25* | " | 6.8 | " | H$_2$ + CH$_4$<br>(100) (3) |
| 26 | " | 6.8 | thermionic emission CVD | H$_2$ + CH$_3$OH<br>(100) (20) |

| Run No.[1] | (C)/(H) | (O)/(C) | Thickness (um) | Wear Quantity at Cutting Test (mm) | Spectrum Area Ratio |
|---|---|---|---|---|---|
| 1 | 0.0652 | 0.67 | 112 | 0.04 | 0.5 |
| 2 | 0.0577 | 0.67 | 89 | 0.05 | 0.7 |
| 3 | 0.0714 | 1 | 94 | 0.04 | 0 |
| 4 | 0.08 | 1.25 | 68 | 0.06 | 3 |
| 5 | 0.0446 | 0.9 | 77 | 0.05 | 1 |
| 6 | 0.0377 | 0.75 | 61 | 0.05 | 4 |
| 7 | 0.0444 | 0.5 | 57 | 0.04 | 0 |
| 8 | 0.0476 | 0.6 | 72 | 0.06 | 1.4 |
| 9* | 0.0142 | 0 | 69 | 0.16 | 44 |
| 10 | 0.0275 | 0.5 | 76 | 0.05 | 3 |
| 11 | 0.0455 | 0.6 | 35 | 0.04 | 1 |
| 12 | 0.1429 | 0.9 | 127 | 0.06 | 10 |
| 13 | 0.0357 | 0.5 | 78 | 0.05 | 7 |
| 14 | 0.0357 | 0.5 | 85 | 0.06 | 0.5 |
| 15 | 0.0049 | 0.5 | 39 | 0.04 | 1.2 |
| 16 | 0.0769 | 0.5 | 99 | 0.05 | 0.3 |
| 17 | 0.0769 | 0.5 | 40 | 0.06 | 0.9 |
| 18* | 0.0049 | 0 | 44 | 0.09 | 28 |
| 19 | 0.019 | 0.5 | 72 | 0.04 | 0.3 |
| 20 | 0.0652 | 0.67 | 63 | 0.05 | 1.6 |
| 21* | 0.0652 | 0.67 | 33 | peeling (cracking) | 0.8 |
| 22* | 0.0652 | 0.67 | 42 | peeling (cracking) | 0.4 |
| 23 | 0.0240 | 0.009 | 24 | 0.12 | 15 |
| 24 | 0.0385 | 0.5 | 6 | 0.01 | 0.3 |
| 25* | 0.0142 | 0 | 7 | 0.09 | 38 |
| 26 | 0.0714 | 1 | 62 | 0.01 | 0.8 |

Note
[1] Each asterisk indicates a comparative run outside the scope of the present invention.
[2] Each parenthesized value indicates the flow rate (SCCM) of the gas.

From the results shown in Table 10, the following can be seen.

In the case where the area ratio of the spectrum of other than diamond to the spectrum of diamond in the diamond film is larger than 10 (runs 9, 18, 23 and 25), the abrasion width is very large at the cutting test. In contrast, in the case where the above-mentioned spectrum area ratio is in the range specified in the present invention, the abrasion width is smaller than 0.08 mm at either the cutting test 1 or the cutting test 2. It is considered that the reason why in diamond films of the present invention where the above-mentioned spectrum area is smaller than 10, the abrasion width is not substantially different is that a film of carbon other than diamond in such a thin thickness as not influencing the cutting properties is formed as the surface layer on the diamond film, and since this carbon film is detected by the spectroscopic analysis, dispersion of numerical values of the area ratio is generated.

In the case where the thermal expansion coefficient of the tool base is smaller than $2.8 \times 10^{-6}/°$ C. (run 21) or larger than $6.0 \times 10^{-6}/°$ C. (run 22), cracks are formed at the film-forming step and peeling is caused at the cutting test.

I claim:

1. A method for the production of diamond films, which comprises introducing a diamond-forming gas into a reaction chamber in which a substrate is located, activating the gas in the reaction chamber by plasma discharge while maintaining the substrate at a temperature of 400°-1400° C. and maintaining the pressure in the reaction chamber at a level of $10^{-5}$ to 100 Torr, and depositing diamond on the substrate by decomposition of the gas, wherein the diamond-forming gas is a gaseous mixture consisting essentially of (i) hydrogen gas and (ii) a vapor or gas of an organic compound having carbon, hydrogen and oxygen as the constituent elements, said organic compound having up to 5 carbon atoms and an O/C atomic ratio of from 0.5 to 1.2, the diamond-forming gas containing hydrogen, oxygen and the carbon atoms at an atomic ratio satisfying requirements represented by the following formulae:

$$0.5 \geqq C/H \geqq 0.01, \text{ and}$$

$$1.2 \geqq O/C \geqq 0.5,$$

and generation of a plasma is effected by introducing a microwave having a frequency of 0.1 to 100 GHz in the reaction chamber, simultaneously, applying a magnetic field to the reaction chamber, and causing the frequency of the microwave to be in agreement with the cyclotron frequency f defined by the following formula:

$$f = eB/2\pi m$$

in which m stands for the mass of electron, e stands for the mass of electron, and B stands for the magnetic flux density, whereby an electron cyclotron resonance plasma is generated.

2. A process for the production of cutting tools, which comprises introducing a diamond-forming gas into a reaction chamber in which a tool base is located and performing the vapor deposition of diamond on the tool base by decomposition of the gas, wherein the diamond-forming gas is a gas or gas mixture containing hydrogen, oxygen and carbon atoms at an atomic ratio satisfying requirements represented by the following formulae:

$$2 \geqq C/H \geqq 0.0005, \text{ and}$$

$$4 \geqq O/C \geqq 0.0005;$$

the diamond-forming as is decomposed by plasma discharge; the generation of the plasma is effected by introducing a microwave having a frequency of 0.1 to 100 GHz in the reaction chamber, simultaneously, applying a magnetic field to the reaction chamber, and causing the frequency of the microwave to be in agreement with the cyclotron frequency f defined by the following formula:

$$f = eB/2\pi m$$

in which m stands for the mass of electron, e stands for the mass of electron, and B stands for the magnetic flux density, whereby an electron cyclotron resonance plasma is generated; the average linear expansion coefficient of the tool base is $2.8 \times 10^{-6}$ to $6.0 \times 10^{-6}/°$ C. when the temperature of the tool base is elevated from room temperature to 800° C.; and the difference of the thermal expansion coefficient between the formed diamond film and the tool base is smaller than $2.0 \times 10^{-6}/°$ C.

3. A process according to claim 2, wherein the tool base has an average linear expansion coefficient of $3.5 \times 10^{-6}$ to $5.0 \times 10^{-6}/°$ C.

4. A process according to claim 2, wherein the tool base is a silicon nitride sintered body.

5. A diamond-covered cutting tool comprising a tool base and a diamond film formed on the surface of the tool base by the film-forming method, wherein the average linear expansion coefficient of the tool base is $2.8 \times 10^{-6}$ to $6.0 \times 10^{-6}/°$ C. when the temperature of the tool base is elevated from room temperature to 800° C., and the diamond film is a polycrystalline diamond film having a thickness of 1 to 200 μm and a spectrum area ratio ($R_I$) smaller than 10, said spectrum area ratio ($R_I$) being defined by the following formula:

$$R_I = I/I_{1330}$$

wherein $I_{1330}$ stands for the area of the characteristic peak in the vicinity of a wave number of 1330 cm$^{-1}$ in the laser Raman spectroscopic analysis of the diamond film, and I stands for the area of peaks at wave numbers of 1000 to 1700 cm$^{-1}$, other than said characteristic peak of diamond, in said spectroscopic analysis.

6. A method for the production of diamond films, which comprises introducing a diamond-forming gas into a reaction chamber in which a substrate is located, activating the gas in the reaction chamber by plasma discharge while maintaining the substrate at a temperature of 400°-1400° C. and maintaining the pressure in the reaction chamber at a level of $10^{-5}$ to 100 Torr, and depositing diamond on the substrate by decomposition of the gas, wherein the diamond-forming gas is a gaseous mixture consisting essentially of (i) hydrogen gas, (ii) a hydrocarbon compound gas and (iii) a vapor or gas of an organic compound having carbon, hydrogen and oxygen as the constituent elements, said organic compound having up to 5 carbon atoms and an O/C atomic ratio of from 0.5 to 1.2, the diamond-forming gas containing hydrogen, oxygen and carbon atoms at an atomic ratio satisfying requirements represented by the following formulae:

$$0.5 \geqq C/H \geqq 0.01, \text{ and}$$

$$1.2 \geqq O/C \geqq 0.5,$$

and generation of a plasma is effected by introducing a microwave having a frequency of 0.1 to 100 GHz in the reaction chamber, simultaneously, applying a magnetic field to the reaction chamber, and causing the frequency of the microwave to be in agreement with the cyclotron frequency f defined by the following formula:

$$f = eB/2\pi m$$

in which m stands for the mass of electron, e stands for the mass of electron, and B stands for the magnetic flux density, whereby an electron resonance plasma is generated.

7. A method for the production of diamond films, which comprises introducing a diamond-forming gas into a reaction chamber in which a substrate is located, activating the gas in the reaction chamber by plasma discharge while maintaining the substrate at a temperature of 400°-1400° C. and maintaining the pressure in the reaction chamber at a level of $10^{-5}$ to 100 Torr, and depositing diamond on the substrate by decomposition of the gas, wherein the diamond-forming gas is a gaseous mixture consisting essentially of (i) hydrogen gas and (ii) a vapor or gas of an organic compound having carbon, hydrogen and oxygen as the constituent elements, said organic compound having up to 5 carbon atoms, the diamond-forming gas containing hydrogen, oxygen and the carbon atoms at an atomic ratio satisfying requirements represented by the following formulae:

$$0.5 \geq C/H \geq 0.01, \text{ and}$$

$$1.2 \geq O/C \geq 0.01,$$

and generation of a plasma is effected by introducing a microwave having a frequency of 0.1 to 100 GHz in the reaction chamber, simultaneously, applying a magnetic field to the reaction chamber, and causing the frequency of the microwave to be in agreement with the cyclotron frequency f defined by the following formula:

$$f = eB/2\pi m$$

in which m stands for the mass of electron, e stands for the mass of electron, and B stands for the magnetic flux density, whereby an electron cyclotron resonance plasma is generated.

8. A method for the production of diamond films, which comprises introducing a diamond-forming gas into a reaction chamber in which a substrate is located, activating the gas in the reaction chamber by plasma discharge while maintaining the substrate at a temperature of 400°-1400° C. and maintaining the pressure in the reaction chamber at a level of $10^{-5}$ to 100 Torr, and depositing diamond on the substrate by decomposition of the gas, wherein the diamond-forming gas is a gaseous mixture consisting essentially of (i) hydrogen gas, (ii) a hydrocarbon compound gas, and (iii) a vapor or gas of an organic compound having carbon, hydrogen and oxygen as the constituent elements, said organic compound having up to 5 carbon atoms, the diamond-forming gas containing hydrogen, oxygen and carbon atoms at an atomic ratio satisfying requirements represented by the following formulae:

$$0.5 \geq C/H \geq 0.01, \text{ and}$$

$$1.2 \geq O/C \geq 0.01,$$

and generation of a plasma is effected by introducing a microwave having a frequency of 0.1 to 100 GHz in the reaction chamber, simultaneously, applying a magnetic field to the reaction chamber, and causing the frequency of the microwave to be in agreement with the cyclotron frequency f defined by the following formula:

$$f = eB/2\pi m$$

in which m stands for the mass of electron, e stands for the mass of electron, and B stands for the magnetic flux density, whereby an electron cyclotron resonance plasma is generated.

* * * * *